United States Patent [19]
Igarashi et al.

[11] Patent Number: 5,894,217
[45] Date of Patent: Apr. 13, 1999

[54] TEST HANDLER HAVING TURN TABLE

[75] Inventors: Noriyuki Igarashi; Kenpei Suzuki, both of Tokyo, Japan

[73] Assignee: Advantest Corp., Tokyo, Japan

[21] Appl. No.: 08/635,411

[22] Filed: Apr. 26, 1996

[30] Foreign Application Priority Data

Apr. 28, 1995 [JP] Japan .................. 7-129844

[51] Int. Cl.$^6$ .................. G01R 31/02
[52] U.S. Cl. .................. 324/158.1; 324/758
[58] Field of Search .................. 324/755, 758, 324/754, 158.1, 73.1

[56] References Cited

U.S. PATENT DOCUMENTS 4,940,935  7/1990  Riley .................. 324/755

Primary Examiner—Ernest F. Karlsen
Attorney, Agent, or Firm—Muramatsu & Associates

[57] ABSTRACT

A test handler decreases an index time in testing IC devices and improves a positioning accuracy for placing the IC devices on a test position of an IC tester. The test handler includes a turn table having a plurality of openings each of which is equally distanced from the other, and at least one of the openings is positioned right above a test socket provided on the IC tester, a plurality of carrier modules attached to the corresponding openings of the turn table where each of the carrier modules has a center opening to receive an IC device to be tested, and a press mechanism provided above the test socket of the IC tester to press the IC device in the carrier module downward so that pins of the IC device contact the test socket. The center opening of the carrier module has tapered walls at the periphery thereof where an upper portion of the center opening is wider than a lower portion of the center opening, and a plurality of guide slits are provided on the tapered walls of the center opening for guiding the pins of the IC device therethrough when the IC device is pressed by the press mechanism.

12 Claims, 3 Drawing Sheets

TEST HANDLER HAVING TURN TABLE

FIELD OF THE INVENTION

This invention relates to a test handler for automatically supplying IC devices to be tested to a test position of an IC tester and collecting the IC devices that have been tested, and more particularly, to a test handler having a turn table which is provided with a plurality of IC device carrier modules and turns at a predetermined rotation speed for supplying the IC devices to the test position and collecting the tested IC devices.

BACKGROUND OF THE INVENTION

In testing IC devices, an automatic test handler is frequently used in combination with an IC tester to automatically provides IC devices (DUT) to be tested to a test position at the test head of the IC tester. There are generally two types of test handlers, a vertical transfer type handler wherein the IC devices to be tested are transferred in a vertical direction with their own gravities and a horizontal transfer type handler wherein IC devices placed on a tray or carrier module are transferred in a horizontal direction to the test position. The test handler of this invention is directed to horizontal transfer type handler.

In a typical horizontal transfer type test handler, IC devices to be tested are aligned on a tray in a loading area and picked, one by one, and transferred to a test head of an IC tester and placed on a test socket of the test head by a pick and place mechanism or a robot hand of the test handler. The tested IC devices are taken out from the test head and transferred to an unloading area and placed on a tray based on the test results.

In this type of handler, the overall paths wherein the IC devices are transferred and handled are lengthy and complicated. Thus, it requires a relatively long time for positioning the IC device to the test socket and start testing and for returning the tested IC device to the unloading are. In the semiconductor test industry, the overall time required for handling the IC device other than the time required for an actual device testing is called an index time.

Since the index time is not the actual time for the device testing, it is considered that the shorter the index time, the higher the test efficiency of the test handler. However, as noted above, the conventional test handler requires a relatively long index time because of the length of device transfer paths and complicated movements of the test handler.

Further, a modern IC device has a large number of pins with a small pitch. In addition, each pin is very small in size and is not mechanically strong. Thus, the test handler for testing such devices having a large number of pins, an ability of precise positioning is required to accurately placing the IC device on a test position, typically a test socket having a large number of corresponding contact pins. However, because the fine positioning of the IC devices needs complicated adjustments of various components, errors tend to arise in placing or extracting the IC devices with respect to the test socket, which deform the pins of the IC devices and make the test unavailable.

An example of a conventional horizontal type test handler is shown in FIG. 5. FIG. 5 is a schematic diagram showing a plan view of a test handler 100. A tray 20 having the IC devices to be tested is transferred from the loading area to a transfer station 21 (dotted line) where each of the IC devices is picked by a suction end 10 of a pick and place mechanism and transferred to a test socket 31 positioned at the test head of an IC tester.

The suction end 10 is provided on a contact arm 50 to be movable along the arm 50 in a back and forth direction (Y). The contact arm 50 can move in a right and left direction (X) along rails 40. Thus, the suction end 10 can freely take a position by the movement in the X and Y directions on a surface of the test handler 100.

By placing the IC device on the test socket 31, an IC tester (not shown) supplies test signals to the IC device on the test socket 31 and the resulted output signals from the IC device are evaluated by the IC tester by comparing them with expected data. The suction end 10 picks the IC devices that have been tested and transferred to a tray on a receiving station 22 (dotted line) and place the IC devices depending on the test results. The IC devices on the tray are transferred to an unloading area 23 where the IC devices are unloaded with the trays for the next process, such as a packing and shipping for customers.

FIG. 4 is a side view showing an example of a suction end used in the pick and place mechanism of FIG. 5. In this example, the suction end 10 is provided with an air pipe (not shown) connected to an air cylinder to provide a suction air force. When the suction air force is at work, the suction end 10 attracts the IC device below and picks up the IC device by the suction air force. As noted above, the suction end 10 is movable in the X and Y directions on the test handler. Thus, the suction end 10 transfers the IC device one by one from the transfer area 21 to the test socket 31 and from the test socket 31 to the receiving station 22 by the X-Y movements as noted above.

During this process involved in the conventional test handler, the operation of placing the IC device on the test socket 31 sometimes fail because of an inaccurate positioning of the IC device with respect to the test socket. Such inaccurate positioning occurs basically because the suction end 10 picks the IC device while moving in the X and Y directions in relatively high speed and thus suction end 10 may not accurately contact the ideal position of the IC device when placing the IC device. Further, the suction end 10 may fail to contact the accurate position of the IC device because of the poor surface condition of an IC device or other factors such as mechanical vibrations.

Therefore, in the conventional test handler as exemplified in FIGS. 4 and 5, a relatively large index time is needed for supplying IC devices to be tested to the IC socket as a result the test efficiency is limited by the index time. In addition, positioning error sometimes occur because of the inaccuracy of picking the IC devices by the pick and place mechanism of the test handler.

SUMMARY OF THE INVENTION

It is therefore, an object of the present invention to provide a test handler which is capable of shortening path length for transferring the IC devices on the test handler.

It is another object of the present invention to provide a test handler which is capable of decreasing an index time which is an overall handling time for each IC device excluding an actual test time of the IC device to improve an overall test efficiency of the test handler.

It is a further object of the present invention to provide a test handler which is capable of accurately positioning the IC devices to be tested on the test position without a positioning error and damages to lead pins of the IC devices.

It is a further object of the present invention to provide a test handler which is capable of providing environmental conditions to the IC devices to be tested during the period after loading the IC devices on the test handler and before reaching test position to perform an environmental test for the IC device.

To achieve these objectives, the test handler of the present invention has a turn table which is provided with a plurality of IC device carrier modules and turns at a predetermined rotation speed for supplying the IC devices to the test position and collecting the tested IC devices.

The test handler of the present invention includes: a turn table having a plurality of openings each of which is equally distanced from the other, and at least one of the opening is positioned at right above a test socket provided on the IC tester; a plurality of carrier modules attached to the corresponding openings of the turn table wherein each of the carrier module has a center opening to receive an IC device to be tested and the center opening of the carrier module has taper like walls at the periphery where an upper portion of the center opening is wider than a lower portion of the center opening; and a press mechanism provided above the test socket of the IC tester wherein the press mechanism presses the IC device in the carrier module downward so that pins of the IC device contact the test socket.

According to the present invention, the test handler having the turn table is capable of shortening distances of transferring the IC devices from the loading area to the test position and from the test position to the unloading area. The test handler can decrease the index time, i.e., the overall handling time for the IC device other than the actual test time by the IC tester to improve an overall test efficiency of the test handler.

In the present invention, the carrier modules are provided at the turn table of the test handler, and the position of the IC device placed on each of the carrier modules is corrected by the pin guide slits provided on the carrier module. Therefore, the test handler of the present invention is capable of accurately positioning the IC devices to be tested on the test position without a positioning error or damages to the IC devices.

Since the turn table of the present invention has a plurality of carrier modules and rotates every time when the test is performed for the IC device at the upper position of the test socket, the other IC devices on the carrier modules can be exposed to the specific environmental conditions prior to the test. Therefore, the test handler of the present invention is capable of performing an environmental test by providing the environmental conditions to the IC devices to be tested during the period after loading the IC devices on the test handler and before reaching test position.

DETAILED DESCRIPTION OF THE PREFERRED EMBODIMENTS

Figure 1:
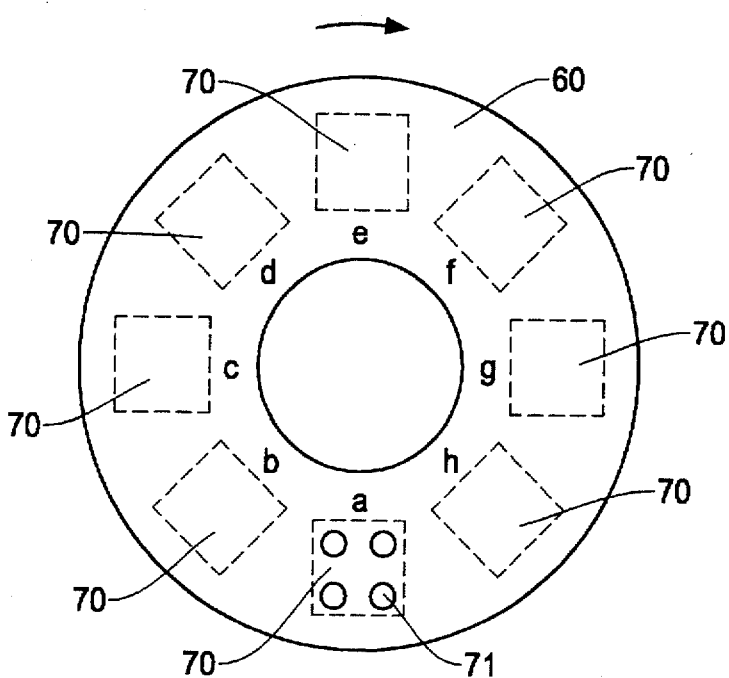
FIG. 1 is a plan view showing an a turn table of a test handler according to the present invention.

The preferred embodiment of the present invention will be explained with reference to the drawings. FIG. 1 shows a turn table 60 to be used in the test handler of the present invention. A plurality of carrier modules 70, in this example, eight carrier modules are attached on the bottom surface of the turn table 60 at the points a–h although a larger number of carrier modules are provided in an actual implementation of the present invention. At each of the points, the turn table 60 has an opening so that an IC device on the carrier modules 70 can be accessed, i.e., loaded and unloaded therethrough, by a handling arm such as a pick and place mechanism of FIG. 4 from above the opening of the turn table 60. Each set of the opening of the turn table 60 and the carrier module 70 is equally distanced from the other.

The turn table 60 rotates in a clockwise direction with respect to its center. At the point a, an IC device in a carrier module 70 is tested and the tested IC device is collected or unloaded from the turn table 60 at the point b. At the point c, an IC device to be tested is loaded on a carrier module 70. At the points d–h, the test handler provide various environmental conditions such as temperature cycles or humidity to the IC devices to be tested.

Figure 4:
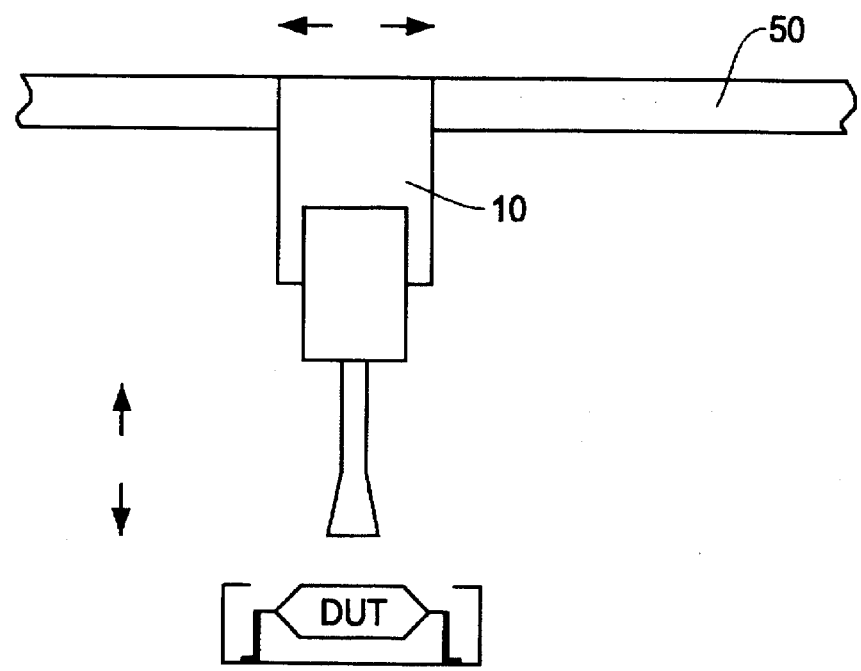
FIG. 4 is a side view showing a suction end used in a pick and place mechanism of a conventional test handler.
Figure 5:
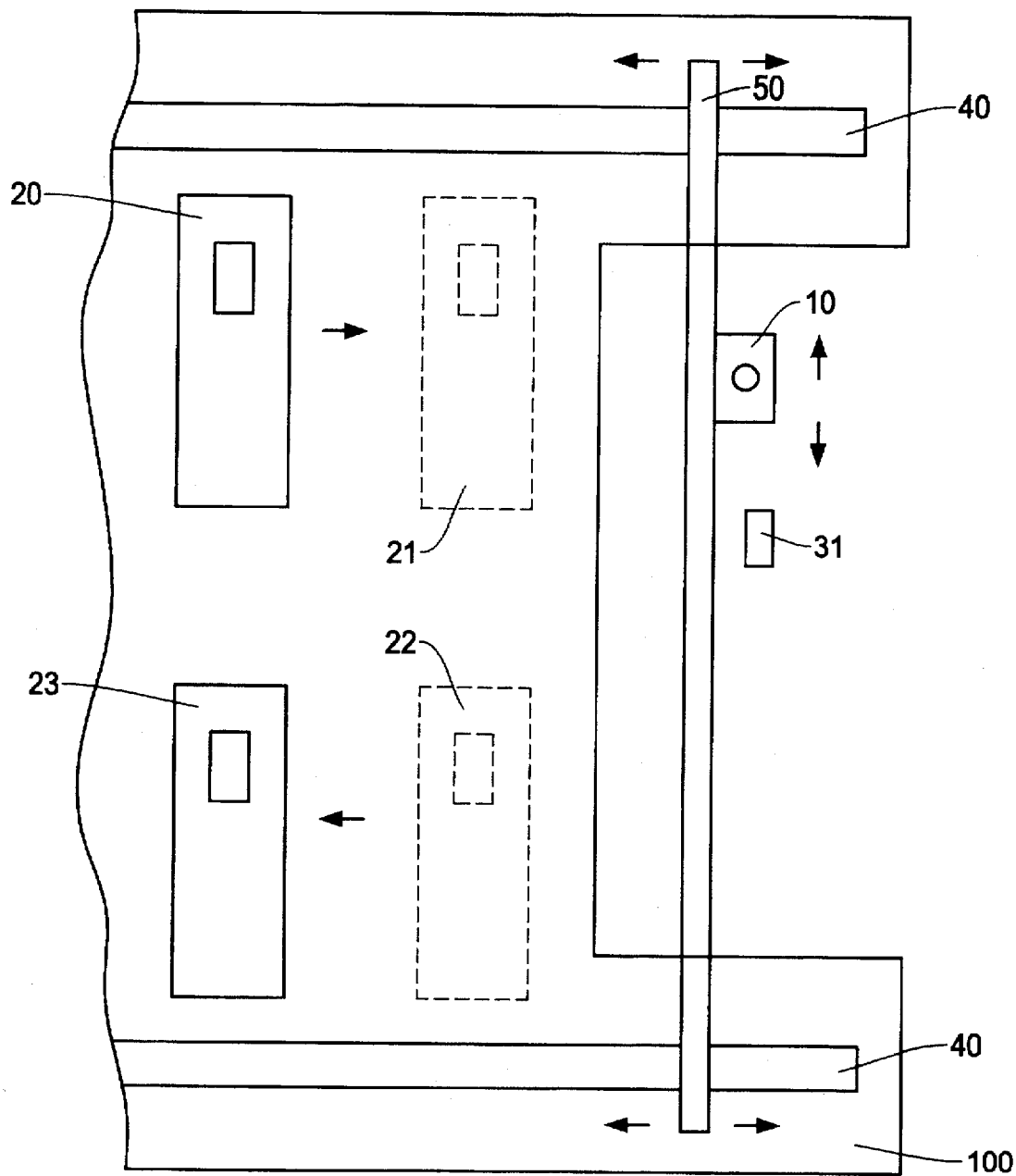
FIG. 5 is a plan view showing the conventional test handler having the pick and place mechanism.

The turn table 60 rotates to the next position every time when the test procedure for the IC device at the point a is completed. The tested IC device is taken out from the position b while the new IC device is loaded at the position c. Preferably, a loading arm and an unloading arm, such as shown in FIG. 4, are separately provided for the loading at the position c and the unloading at the position b, respectively. The IC device that was in the position h is now positioned at the point a to be tested by the IC tester. In this manner, the IC devices are consecutively loaded, experienced the environmental conditions, tested and unloaded when the turn table 60 rotates. Although the turn table rotates in the clockwise direction in the above example, it is also possible to rotates in both clockwise and counter clockwise directions.

Figure 2:
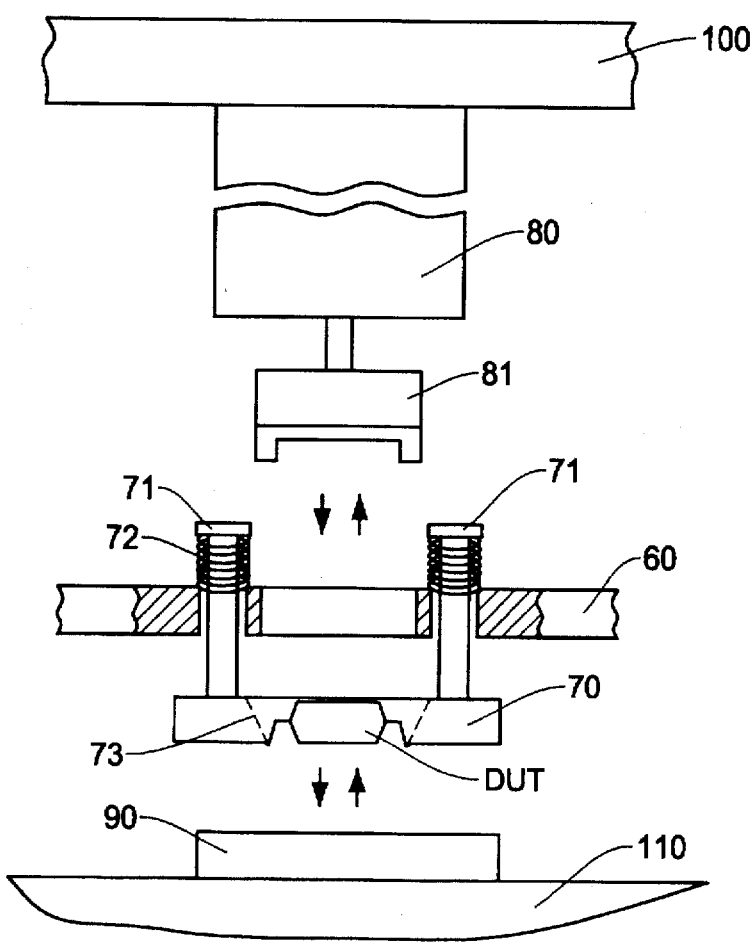
FIG. 2 is a schematic view showing a side view of the embodiment of the present invention including a press mechanism, a turn table and a test socket.

FIG. 2 is a schematic view showing a side view of the embodiment of the present invention including a press mechanism, the turn table 60 of FIG. 1 and a test socket. A press mechanism 80 is arranged right above the point a of the turn table 60 on a test handler housing 100. The press mechanism 80 includes a press head 81 which moves in a vertical direction for pressing the IC device (DUT) in the carrier module 70 downward. An IC tester 110 is shown at the bottom of FIG. 2 on which a test socket 90 is mounted.

The carrier module 70 is attached to the turn table 60 through a plurality of columns 71. The carrier module 70 is mounted in a manner which is flexible on the turn table 60 because of springs 72 employed for the columns 71. Thus, the carrier module 70 moves downward against the forces of the springs 72 when pressed by the press head 81. The press head 81 goes down through the opening of the turn table 60 and presses the DUT on the carrier module 70. Thus, the pins of the DUT electrically contact with the test socket 90 wherein test signals from the IC tester 110 are provided to the DUT and the resulted output signals from the DUT are received by the IC tester 110 to be compared with expected data. After the test, the press head 81 moves to the upper direction to release the carrier module 70 and the DUT. Then the turn table 60 rotates so that the DUT that has been tested is positioned at the point b where it is unloaded by handling arm (pick and place mechanism) such as shown in FIG. 4.

Figure 3:
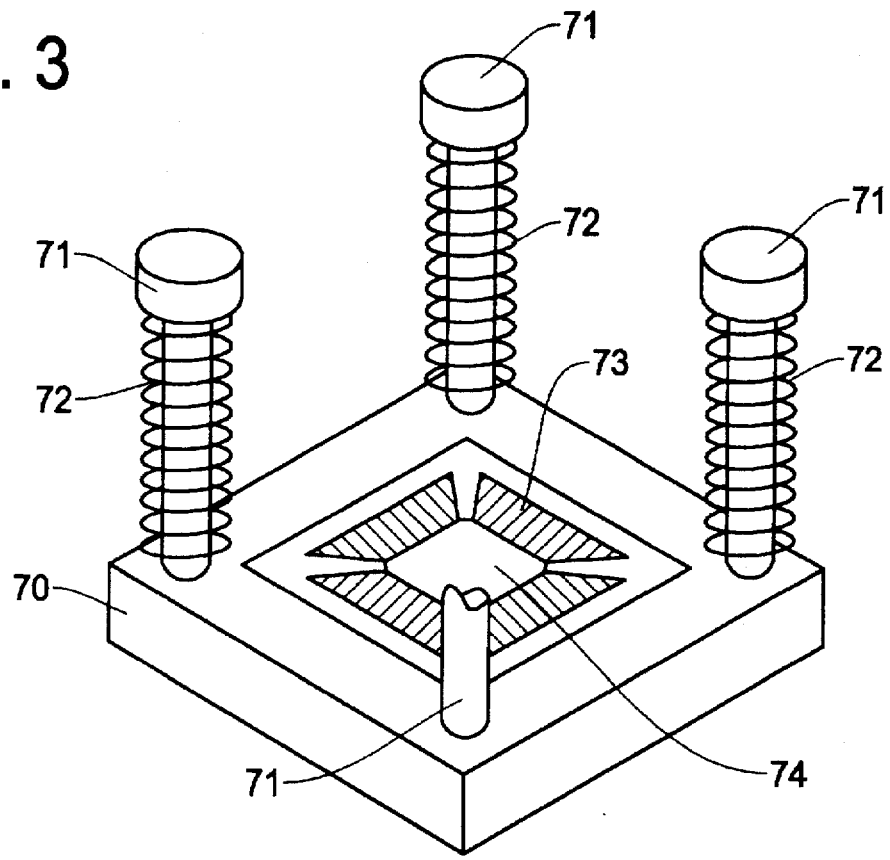
FIG. 3 is a perspective view showing a test carrier to be used for the turn table of FIG. 1.

FIG. 3 is a perspective view showing a more detailed structure of the carrier module 70 of the present invention. The carrier module 70 has a center opening 74 which is accurately sized to receive a particular kind of IC device to be tested. A plurality of pin guide slits 73 are provided at the periphery of the opening 74. Each of the pin guide slits 73 receives a corresponding pin of the IC device to be tested and guides the pin downward when the IC device is pressed by the press head 81.

Since the pin guide slits 73 are provided at the periphery of the opening 74 which is formed of taper like walls having a wider opening at the upper position, the pins of the IC device are guided through the pin guide slits 73 so that the pins are accurately positioned at the lower position of the carrier module 70. Namely, even when the IC device is placed on the carrier module 70 with a certain positional inaccuracy, the position is corrected by the pin guide slits provided on the taper like walls of the carrier module 70 when pressed toward the test socket 90.

At each corner of the carrier module 70, a through hole is provided to receive a column 71 therethrough so that the carrier module is fixed to the turn table 60. As noted above, the springs 72 are mounted between the heads of the columns 71 and the turn table 60. Other than the time for testing the IC device in the carrier module 70, the carrier modules 70 are attracted to the turn table 60 because of the actions of the springs 72. The carrier modules 70 move downward against the forces of the springs 72 when pressed by the press head 81. The press head 81 presses the DUT so that the pins of the DUT electrically contact with contact pins of the test socket 90 wherein the IC device is evaluated by the IC tester. After the test, the press head 81 goes back to release the carrier module 70 so that the carrier module returns to the lower surface of the turn table 60.

Since the size and the number of pins of the IC devices to be tested vary, a plurality of sets of the turn table and the carrier modules are preferably provided. Each set of the turn table and the carrier modules is replaced with other set when the different kind of IC device of different size or pin numbers are to be tested.

As in the foregoing, according to the present invention, the test handler having the turn table is capable of shortening distances of transferring the IC devices from the loading area to the test position and from the test position to the unloading area. The test handler can decrease the index time, i.e., the overall handling time for the IC device other than the actual test time by the IC tester to improve an overall test efficiency of the test handler.

In the present invention, the carrier modules are provided at the turn table of the test handler, and the position of the IC device placed on each of the carrier modules is corrected by the pin guide slits provided on the carrier module. Therefore, the test handler of the present invention is capable of accurately positioning the IC devices to be tested on the test position without a positioning error and damages to the IC devices.

Since the turn table of the present invention has a plurality of carrier modules and the turn table rotates every time when the test is performed for the IC device at the upper position of the test socket, the other IC devices on the carrier modules can be exposed to the specific environmental conditions prior to the test. Therefore, the test handler of the present invention is capable of performing an environmental test by providing the environmental conditions to the IC devices to be tested during the period after loading the IC devices on the test handler and before reaching test position.

What is claimed is:

1. A test handler for handling IC devices for testing the IC devices by an IC tester, comprising:

a turn table having a plurality of openings each of which is equally distanced from the other, at least one of said openings being positioned right above a test socket provided on the IC tester, said turn table rotating in a step manner with a predetermined speed;

a plurality of carrier modules provided at a lower surface of the turn table and attached to the corresponding openings of the turn table, each of said carrier modules having a center opening to receive an IC device to be tested, said center opening of said carrier module having tapered walls at a periphery thereof wherein an upper portion of said center opening is wider than a lower portion of said center opening, and a plurality of guide slits are provided on said tapered walls of said center opening for guiding pins of said IC device therethrough; and a press mechanism provided above said turn table and said test socket on said IC tester, said press mechanism pressing said IC device in said carrier module downward so that said pins of said IC device contact said test socket.

2. A test handler as defined in claim 1, wherein said guide slits guide said pins of said IC device when said IC device is pressed downward by said press mechanism.

3. A test handler as defined in claim 1, wherein each of said carrier modules is attached to said lower surface of said turn table by a plurality of columns, and a plurality of springs are provided to said columns, each of said springs being mounted in a manner to attract said carrier module in a upward direction toward said lower surface of said turn table.

4. A test handler as defined in claim 1, wherein said IC devices to be tested are experienced predetermined environmental conditions prior to reaching the position above said test socket by said rotation of said turn table.

5. A test handler for handling IC devices for testing the IC devices by an IC tester, comprising:

a turn table having a plurality of openings each of which is equally distanced from the other, said turn table rotating in a predetermined speed in a step by step manner so that each of said plurality of openings is shifted to a previous position of an adjacent opening, one of said openings being positioned to a test location which is right above a test socket provided on the IC tester at each step of said rotation;

a plurality of carrier modules provided at a lower surface of the turn table and attached to the corresponding openings of the turn table, each of said carrier modules having a center opening to receive an IC device to be tested, said center opening of said carrier module having tapered walls at a periphery thereof wherein an upper portion of said center opening is wider than a lower portion of said center opening, and a plurality of guide slits are provided on said tapered walls of said center opening for guiding pins of said IC device therethrough; and a press mechanism provided above said turn table and said test socket on said IC tester, said press mechanism pressing said IC device in said carrier module downward so that said pins of said IC device contact said test socket;

wherein said IC device that has been tested is unloaded at an unload position next to said test location relative to a direction of said rotation and a new IC device to be tested is loaded at a load position next to said unload position relative to said direction of said rotation.

6. A test handler as defined in claim 5, further comprising a handling arm for unloading said IC device that has been tested at said unload position and for loading said new IC device to be tested at said load position.

7. A test handler as defined in claim 6, wherein said handling arm includes a suction end to attract said IC devices by a suction force to pick and place said IC devices.

8. A test handler as defined in claim 5, further comprising an unloading arm for unloading said IC device that has been tested at said unload position and a loading arm for loading said new IC device to be tested at said load position.

9. A test handler as defined in claim 8, wherein each of said unloading and loading arms includes a suction end to attract said IC devices by a suction force to pick and place said IC devices.

10. A test handler as defined in claim 5, wherein said guide slits guide said pins of said IC device when said IC device is pressed downward by said press mechanism.

11. test handler as defined in claim 5, wherein each of said carrier modules is attached to said lower surface of said turn table by a plurality of columns, and a plurality of springs are provided to said columns, each of said springs being mounted in a manner to attract said carrier module in a upward direction toward said lower surface of said turn table.

12. A test handler as defined in claim 5, wherein said IC devices to be tested are experienced predetermined environmental conditions prior to reaching the position above said test socket by said rotation of said turn table.

* * * * *